United States Patent
Seka

(10) Patent No.: US 10,975,801 B2
(45) Date of Patent: Apr. 13, 2021

(54) INTEGRATED TEST METHOD FOR TESTING THE ELECTRICAL OPERATION OF A THRUST REVERSER OF AN AIRCRAFT TURBOJET, AND AN ASSOCIATED SYSTEM

(71) Applicant: SAFRAN AIRCRAFT ENGINES, Paris (FR)

(72) Inventor: Florian Boni Seka, Moissy-Cramayel (FR)

(73) Assignee: SAFRAN AIRCRAFT ENGINES, Paris (FR)

(*) Notice: Subject to any disclaimer, the term of this patent is extended or adjusted under 35 U.S.C. 154(b) by 88 days.

(21) Appl. No.: 16/327,537

(22) PCT Filed: Aug. 10, 2017

(86) PCT No.: PCT/FR2017/052216
§ 371 (c)(1),
(2) Date: Feb. 22, 2019

(87) PCT Pub. No.: WO2018/037182
PCT Pub. Date: Mar. 1, 2018

(65) Prior Publication Data
US 2019/0186416 A1    Jun. 20, 2019

(30) Foreign Application Priority Data
Aug. 24, 2016  (FR) .................................. 1657895

(51) Int. Cl.
*G01R 31/34* (2020.01)
*F02K 1/76* (2006.01)
*B64F 5/60* (2017.01)

(52) U.S. Cl.
CPC .................. *F02K 1/76* (2013.01); *B64F 5/60* (2017.01); *G01R 31/34* (2013.01); *F05D 2260/80* (2013.01); *F05D 2260/83* (2013.01)

(58) Field of Classification Search
CPC ................. F02K 1/76–766; B64F 5/60; G01R 31/34–343; B64C 19/00; B64C 15/00–14
See application file for complete search history.

(56) References Cited

U.S. PATENT DOCUMENTS 3,920,203 A * 11/1975 Moorehead ............... F02K 1/70
                                                           244/207
2003/0218887 A1* 11/2003 Kojori .................... H02M 7/797
                                                           363/16

(Continued)

FOREIGN PATENT DOCUMENTS

CN     101019303 A     8/2007
CN     101237286 A     8/2008

(Continued)

OTHER PUBLICATIONS

International Search Report dated Nov. 8, 2017, in PCT/FR2017/052216 filed on Aug. 10, 2017.

*Primary Examiner* — Patrick Assouad
*Assistant Examiner* — Demetrius R Pretlow
(74) *Attorney, Agent, or Firm* — Oblon, McClelland, Maier & Neustadt, L.L.P.

(57) ABSTRACT

An integrated test method for testing the operation of an electrical power converter powered by an on-board power supply network and using field-oriented control to control a three-phase electric motor for a thrust reverser of a turbojet of an aircraft is provided. The method includes: receiving an order to initiate the integrated test; controlling the converter from a current setpoint defined from a non-zero in-phase component and a zero quadratic component; measuring the currents delivered on each of the three outlet phases of said (Continued)

converter; determining in-phase and quadratic components of the three phase currents previously measured; comparing these components with the in-phase and quadratic components of the current setpoint; and sending a notification concerning the malfunctioning or the functioning of the thrust reverser as a function of the result of the comparison.

9 Claims, 1 Drawing Sheet

(56) References Cited

U.S. PATENT DOCUMENTS

| | | | |
|---|---|---|---|
| 2005/0075769 A1* | 4/2005 | Eschborn | G07C 5/0825 |
| | | | 701/33.4 |
| 2010/0252691 A1* | 10/2010 | Malkin | H02J 3/14 |
| | | | 244/76 R |
| 2011/0083416 A1* | 4/2011 | Scothern | F02C 3/10 |
| | | | 60/226.1 |
| 2012/0109424 A1* | 5/2012 | Fervel | B64C 13/505 |
| | | | 701/3 |
| 2012/0280641 A1 | 11/2012 | Lejeune et al. | |
| 2013/0119664 A1* | 5/2013 | Pereira | F02N 11/04 |
| | | | 290/46 |
| 2015/0137725 A1* | 5/2015 | Maalioune | F02K 1/763 |
| | | | 318/504 |
| 2015/0222214 A1 | 8/2015 | Maloum et al. | |

FOREIGN PATENT DOCUMENTS

| | | |
|---|---|---|
| CN | 101743730 A | 6/2010 |
| CN | 102396200 A | 3/2012 |
| CN | 204241652 U | 4/2015 |
| CN | 107144787 A | 9/2017 |
| FR | 2 919 772 A1 | 2/2009 |
| GB | 0709094 | 6/2007 |
| JP | 2004-112939 A | 4/2004 |

* cited by examiner

INTEGRATED TEST METHOD FOR TESTING THE ELECTRICAL OPERATION OF A THRUST REVERSER OF AN AIRCRAFT TURBOJET, AND AN ASSOCIATED SYSTEM

BACKGROUND OF THE INVENTION

The invention relates to an integrated test method for testing the operation of the electrical control system for reversing thrust of an aircraft turbojet.

In an aircraft, the architecture of electric thrust reversers generally relies on an electrical converter of variable drive speed, or power controller, coupled to an electric motor driving an actuator system for actuating a thrust reverser.

The electrical converter transforms the electrical power supply of the aircraft to produce as output mechanical torque on a drive shaft and thereby deliver mechanical power to the entire linkage responsible for reversing thrust.

The operation of that electrical converter cannot be tested in flight. More precisely, it is not possible at present to test the operation of such an electrical converter prior to making use of thrust reverser. The main and logical reason is that activating thrust reversers in flight is prohibited since it generates reverse thrust and a loss of speed at an inappropriate instant.

Thus, at present, potential unavailability of the electrical converter of the actuator system can be detected in flight only at the moment when the reversal function is required. The pilot thus becomes aware of a malfunction only at the time of activating thrust reversal while landing.

OBJECT AND SUMMARY OF THE INVENTION

The invention seeks to provide an integrated test method that makes it possible, while the aircraft is in flight, to carry out a test of the operation of the electrical power converter controlling the electric motor that actuates a thrust reverser of a turbojet, and thereby reduce the dormancy periods that are applied to such systems for reasons of operational safety.

The invention provides an integrated test method for testing the operation of an electrical power converter controlling a three-phase electric motor configured to actuate a thrust reverser of a turbojet of an aircraft, the electrical power converter controlling the electric motor by means of field-oriented control generating currents that are defined from an in-phase current component and a quadrature current component, the method comprising the following steps:

a) receiving an order to initiate the integrated test;

b) controlling the electrical power converter using a current setpoint defined from a non-zero in-phase component and a zero quadratic component;

c) measuring the currents delivered on each of the three outlet phases of the electrical power converter;

d) determining in-phase and quadratic components of the three phase currents measured in the preceding step;

e) comparing the in-phase and quadratic components of the measured current with the in-phase and quadratic components of the current setpoint; and f) sending a notification to the crew of the aircraft concerning the malfunctioning or the functioning of the thrust reverser as a function of the result of said comparison.

This method can be performed without modifying the existing loops for regulating the electrical power converter controlling the three-phase electric motor, it is only the setpoints that are input to those loops that are modified.

The method also makes it possible to inform the crew that a thrust reverser is unavailable prior to starting a stage of landing.

In an electric machine, in particular a permanent magnet three-phase synchronous machine, the currents in the three phases of the stator are sinusoidal, and they are at mutual offsets of $2\pi/3$ rad. These currents create a rotating magnetic field in the electric machine. The rotor is made up of permanent magnets, e.g. having one to five pairs of poles. Like a compass needle, the rotor naturally becomes aligned with the rotating magnetic field created by the stator. It is the amplitudes of the stator currents and the power of the rotor magnets that create the torque needed for rotating the machine. In order to control these currents, it is therefore necessary to apply sinusoidal voltages to each phase of the stator, which voltages are likewise at $2\pi/3$ rad phase offsets.

In general, it is simpler to apply regulation to constants than to sinusoidal signals. The Park transform, which is a transform for three-phase systems, is generally used in order to project a three-phase system onto a two-dimensional space, referred to as "Park" space, in order to process the regulation of the currents in an equivalent single-phase system. It is thus possible to transpose the three sinusoidal currents and the three sinusoidal voltages of the stator, relating to the three phases of a three-phase system, into a space where the three sinusoidal current or voltage signals are expressed in the form of two constant current or voltage signals, one on the in-phase axis Xd and the other on the quadrature axis Xq. To do this, the Park reference frame relies on a reference frame tied to the rotating field, which for a synchronous machine is a reference frame tied to the rotor.

By working with currents and voltages expressed in a plane tied to a transform of three-phase systems such as the Park space, it becomes possible to act on currents or voltages that are constant, rather than on sinusoidal signals, in order to regulate the three-phase machine that is being controlled.

The Park transform that makes it possible to control a rotary three-phase electric machine from a system having two components, an in-phase component and a quadrature component.

Field-oriented control of an electrical converter relies on such two-component control. Field-oriented control has the advantage of reducing the control of a three-phase electrical machine, and in particular of a permanent magnet synchronous machine, to regulating two current magnitudes, an in-phase component and a quadratic component, in the electrical rotating reference frame of the machine.

The quadrature component of the current, written Iq, is proportional to the torque developed by the motor. It is thus the adjustment magnitude that is used for regulating the torque, or indeed the speed and the position of the mechanical system, when the thrust reverser is actuated. The in-phase component of the current, written Id, is generally maintained at a value of zero.

The test method is integrated in that it can be initiated by the airplane system in flight or on request from the crew in flight or during an approach.

This integrated test makes it possible to power the electrical converter with electricity and to activate a particular mode of the converter, which mode consists in regulating the electrical power by using a nonzero setpoint for the in-phase component of the current and a zero setpoint for the quadratic component of the current so as to produce current flows in the inverter stage of the converter and current flows in the electric motor, but without the motor developing any mechanical torque.

As a result, the retention elements are not subjected to mechanical force and no deployment is initiated in flight. There is thus no damage to the latches, and no force is applied to the braking systems.

Furthermore, measuring currents that comply with the setpoint makes it possible to confirm not only that the airplane power supply is available, but also that the entire electrical converter system and its components are available, that the harness connecting the converter to the motor is operational, and that the motor windings are in a nominal state.

In a first aspect of the integrated test method, a warning notification is sent in step f) if the measured components differ from the current setpoint components with variance greater than a predetermined threshold that is variable as a function of specific features of the application.

In other words, if the variant of the comparison performed in step e) is greater than a predetermined threshold, then a warning notification is sent in step f), the predetermined threshold varying as a function of specific features of the application.

In a second aspect of the integrated test method, no notification is sent if the measured components correspond to the current setpoint components with variance less than a decision threshold that is variable as a function of specific features of the application.

In a variant, a notification that the test has been successful and the thrust reverser is functioning properly is sent if the measured components correspond to the current setpoint components with variance less than a decision threshold that is variable as a function of specific features of the application.

In a third aspect of the method, the method may comprise performing the steps b) to e) for each turbojet of the aircraft, the steps b) to e) being performed simultaneously for all of the turbojets or successively for each turbojet.

The integrated test can thus be performed on all of the thrust reversers of the airplane, either together or sequentially. In the event of a failure of this integrated test, the pilot is informed about the loss of the thrust reverser function for the engine(s) in question.

The invention also provides a control system for implementing a stage of testing an electrical power converter for integrating in an electrical power converter for controlling a three-phase electric motor configured to actuate a thrust reverser of a turbojet of an aircraft, the electrical power converter being for powering by an electrical power supply network of the aircraft and being controlled by means of a field-oriented control using a current setpoint defined from an in-phase current component and a quadratic current component.

According to a general characteristic of the invention, the system comprises receiver means for receiving an order to initiate the integrated test, control means for controlling the electrical power converter from a current setpoint defined from a nonzero in-phase component and a zero quadratic component, measurement means for measuring the current delivered on each of the three outlet phases of the electrical power converter, determination means for determining the in-phase and quadratic components of the three phase currents measured, comparator means for comparing the in-phase and quadratic components of the measured current with the in-phase and quadratic components of the current setpoint, and sender means for sending a notification to the crew of the aircraft concerning malfunctioning or functioning of the thrust reverser and configured to send a notification as a function of the result of said comparison.

The means of the system may be electronic modules or means that are implemented by software.

The invention also provides an electrical power converter for being powered by an electrical power supply network of an aircraft and for being coupled to a three-phase electric motor configured to actuate a thrust reverser of a turbojet of the aircraft, the converter being configured to be controlled by means of field-oriented control using a current setpoint defined from an in-phase current component and a quadratic current component.

According to a general characteristic of the invention, the electrical power converter includes a control system for implementing a stage of testing the operation of said electrical power converter as defined above.

The invention also proposes a turbojet including an electrical power converter as defined above that is electrically coupled to a permanent magnet synchronous electric motor configured to actuate a thrust reverser of a turbojet of an aircraft.

The invention also proposes an aircraft including at least one turbojet as defined above.

BRIEF DESCRIPTION OF THE DRAWING

The invention can be better understood on reading the following description given by way of non-limiting indication and with reference to the accompanying drawing, in which.

DETAILED DESCRIPTION OF IMPLEMENTATIONS

Figure 1:
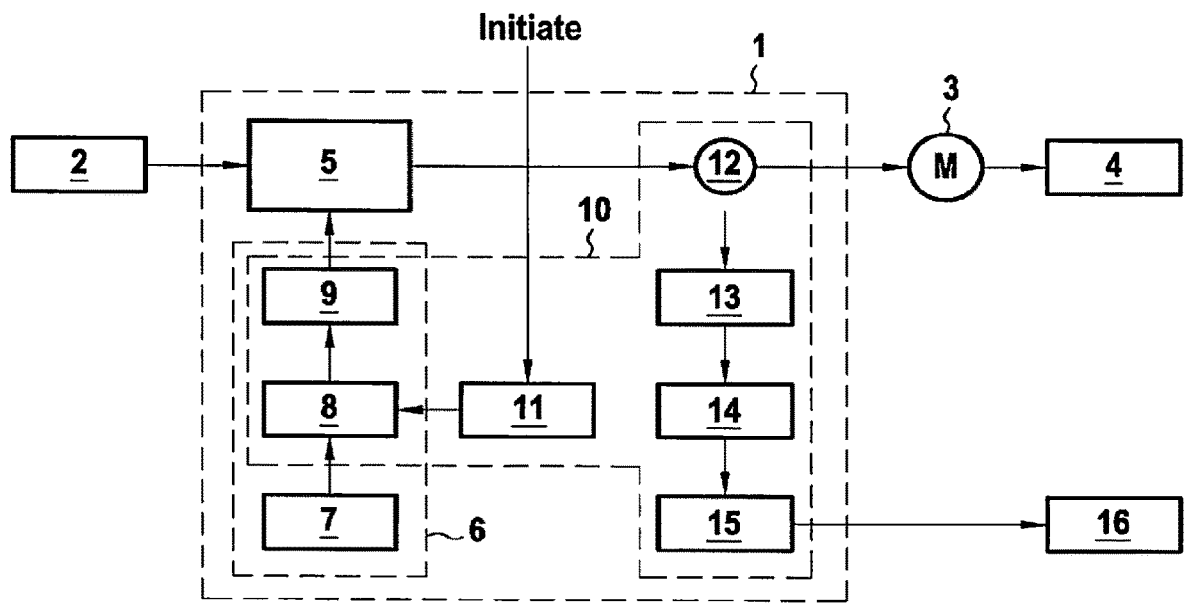
FIG. 1 is a block diagram of a thrust reverser system for an aircraft turbojet.

FIG. 1 is a diagram of a thrust reverser system for an aircraft turbojet.

The thrust reverser system comprises an electrical power converter 1 powered by an electrical power supply network 2 on board the aircraft. The electrical power converter 1 has its output electrically connected to an electric motor 3 that has its output mechanically coupled to a mechanical thrust reverser actuator device 4.

In this embodiment, the electric motor 3 is a permanent magnet synchronous motor.

The electrical power converter 1 comprises a power block 5 having controlled switches for modulating the current as delivered as input to the power block 5 from the electrical power supply network 2 and for delivering three-phase electricity to the electric motor 3. The power block 5 is configured to be controlled by means of field-oriented control using a current setpoint defined from an in-phase current component Id and a quadratic current component Iq. The electrical power converter 1 also has control means 6 for controlling the power block 5 for thrust reversal.

The control means 6 comprise a module 7 for generating loops for regulating speed and position, having the function of ensuring deployment and retraction profiles for the inverter that are compatible with the desired loads and linkages, the module 7 having its output coupled to a control module 8 for controlling the loops for regulating the in-phase and quadratic components Id_cons and Iq_cons of the current setpoints, the module 8 having its outlet coupled to a module 9 for generating control pulses connected to the power block 5 and configured to control the controlled switches of the power block 5.

The electrical power converter 1 also comprises a control system 10 for controlling a stage of testing the electrical power converter 1.

The control system 10 comprises receiver means 11 for receiving an order to initiate the integrated test, which order may be generated by a member of the crew of the aircraft activating a test activation button, and control means for controlling the electrical power converter in test mode.

In this embodiment, the control means for controlling the electrical power converter in test mode comprise both the control module 8 for controlling loops for regulating the in-phase and quadratic components $I_{d\_cons}$ and $I_{q\_cons}$ with the current setpoints, and also the module 9 for generating control pulses.

On receiving a signal sent by the receiver means 11, the module 8 prepares a current setpoint from a non-zero in-phase component Id_cons and a zero quadratic component Iq_cons, and the module 9 delivers commands to the power block 5.

The control system 10 also has measurement means 12 for measuring the currents delivered on each of the three phases output by the electrical power converter 1, and more precisely connected to the outlet of the power block 5. The control system 10 also has determination means 13 for determining the in-phase and quadratic components of the three phase currents measured by the measurement means 12, and comparator means 14 for comparing the in-phase and quadratic components of the measured current with the in-phase and quadratic components of the current setpoint.

Finally, the control system 10 has sender means 15 for sending a notification to the crew of the aircraft when there is a thrust reversal malfunction. The sender means 15 are configured to send a notification as a function of the result of said comparison, the notification being displayed on a display 16 visible to the members of the crew of the aircraft.

Figure 2:
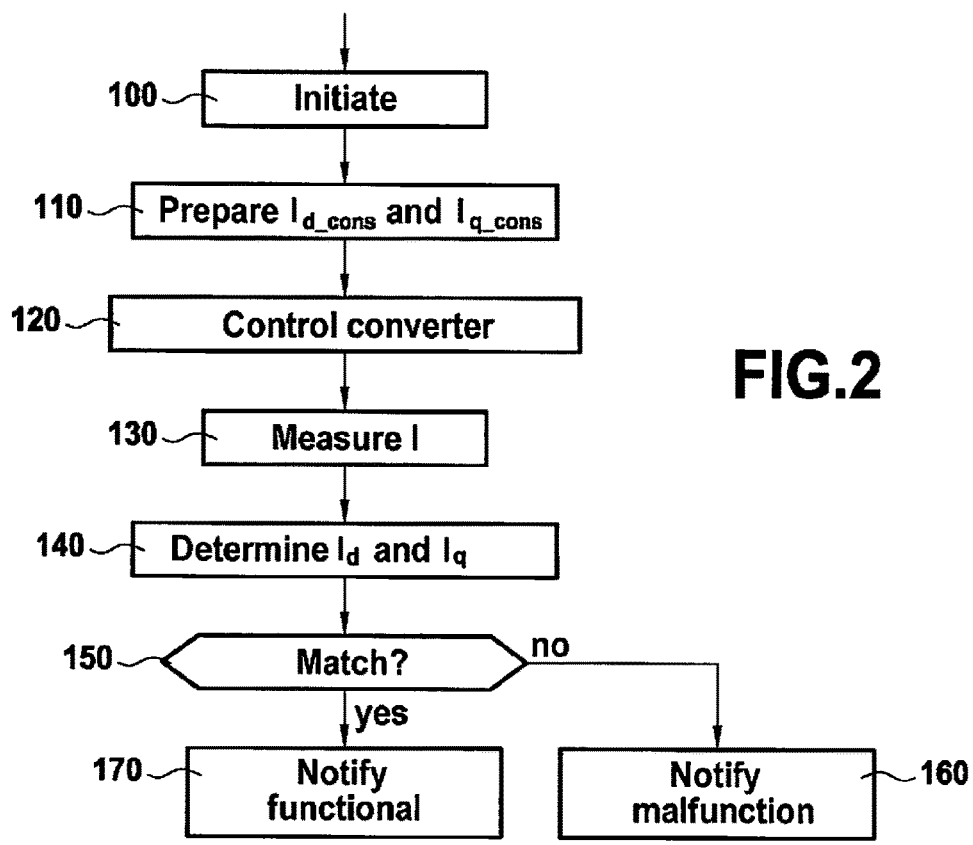
FIG. 2 is a flow chart summarizing an integrated test method for testing the operation of an electrical power converter of the FIG. 1 thrust reverser system.

The test phase is implemented using the method summarized by the block diagram shown in FIG. 2.

The method begins with a first step 100 of receiving an order to initiate the integrated test. In this example, the command is generated by a member of the aircraft crew activating a test actuation button. In a variant, the command may be initiated in automatic manner.

In a following step 110, a current setpoint is generated that is defined from a non-zero in-phase component and from a zero quadratic component, and then in a following step 120, the power block 5 of the electrical power converter 1 is controlled on the basis of the current setpoint prepared in the preceding step 110.

Thereafter, in a following step 130, the currents delivered on each of the three outlet phases from the electrical power converter 1 are measured.

In a following step 140, the in-phase and quadratic components of the three-phase current as measured in the preceding step 130 are determined, and then in a step 150, the in-phase and quadratic components of the measured current are compared with the in-phase and quadratic components of the current setpoint.

If the measured components differ from the setpoint current component with variance greater than a predetermined decision threshold, e.g. 10%, then a warning notifying malfunction of thrust reversal is sent in a step 160 to a display 16 arranged in the aircraft.

In contrast, if the measured components correspond to the setpoint current component with variance less than the predetermined decision threshold, then in a step 170, a notification of proper operation of thrust reversal is sent to the display 16.

In a variant, proper operation may be indicated by not sending ant notification, with a malfunction notification being sent only in the event that the measured components differ from the setpoint current components with variance greater than a predetermined decision threshold.

Steps 110 to 170 may be performed simultaneously or in succession for each turbojet of the aircraft.

The invention thus provides an integrated test method making it possible, while an aircraft is in flight, to cause a test to be performed of the operation of the electrical converter controlling the electric motor that actuates a turbojet thrust reverser, and thereby reduce the dormancy periods applied to such systems for reasons of operational safety.

The invention claimed is:

1. An integrated test method for testing an operation of an electrical power converter controlling a three-phase electric motor configured to actuate a thrust reverser of an aircraft turbojet, the electrical power converter being powered by an electrical power supply network of the aircraft and being controlled by field-oriented control using a current setpoint defined from an in-phase current component and a quadratic current component, the method comprising:
 a) receiving an order to initiate the integrated test;
 b) controlling the electrical power converter using a current setpoint defined from a non-zero in-phase component and a zero quadratic component;
 c) measuring currents delivered on each of the three outlet phases of the electrical power converter;
 d) determining in-phase and quadratic components of the three phase currents measured in step c);
 e) comparing the in-phase and quadratic components of the measured current with the in-phase and quadratic components of the current setpoint; and
 f) sending a notification to a crew of an aircraft concerning malfunctioning or functioning of the thrust reverser as a function of a result of said comparing.

2. The method according to claim 1, wherein a warning notification is sent in step f) if the measured components differ from the current setpoint components with variance greater than a predetermined decision threshold.

3. The method according to claim 1, wherein no notification is sent if the measured components correspond to the current setpoint components with variance less than a predetermined decision threshold.

4. The method according to claim 1, wherein a notification that the test has been successful and that the thrust reverser is operating properly is sent if the measured components correspond to the current setpoint components with variance less than a predetermined decision threshold.

5. The method according to claim 1, comprising performing the steps b) to f) for each turbojet of the aircraft, the steps b) to f) being performed simultaneously for all of the turbojets or successively for each turbojet.

6. A control system for implementing a stage of testing an electrical power converter, the control system being for integrating in the electrical power converter for testing, said converter being for controlling a three-phase electric motor configured to actuate a thrust reverser of a turbojet of an aircraft, the electrical power converter being for powering by an electrical power supply network of the aircraft and being controlled by field-oriented control using a current setpoint defined from an in-phase current component and a quadratic current component, the system comprising:

circuitry configured to
- receive an order to initiate the integrated test;
- control the electrical power converter from a current setpoint defined from a nonzero in-phase component and a zero quadratic component;
- measure current delivered on each of the three outlet phases of the electrical power converter;
- determine in-phase and quadratic components of the three measured outlet phase currents;
- compare the in-phase and quadratic components of the measured current with the in-phase and quadratic components of the current setpoint; and
- send a notification to a crew of an aircraft concerning malfunctioning or functioning of the thrust reverser as a function of a result of said comparison.

7. An electrical power converter for being powered by an electrical power supply network of an aircraft and for being coupled to a three-phase electric motor configured to actuate a thrust reverser of a turbojet of the aircraft, said converter being configured to be controlled by field-oriented control using a current setpoint defined from an in-phase current component and a quadratic current component, the electrical power converter comprising:
- a control system for implementing a stage of testing the operation of said electrical power converter according to claim 6.

8. A turbojet including an electrical power converter according to claim 7, that is electrically coupled to a permanent magnet synchronous electric motor configured to actuate a thrust reverser of a turbojet of an aircraft.

9. An aircraft including at least one turbojet according to claim 8.

* * * * *